United States Patent [19]
Fletcher et al.

[11] Patent Number: 5,155,387
[45] Date of Patent: Oct. 13, 1992

[54] CIRCUIT SUITABLE FOR DIFFERENTIAL MULTIPLEXERS AND LOGIC GATES UTILIZING BIPOLAR AND FIELD-EFFECT TRANSISTORS

[75] Inventors: Thomas D. Fletcher, Portland, Oreg.; Edward A. Burton, Lindon, Utah

[73] Assignee: North American Philips Corp., Tarrytown, N.Y.

[21] Appl. No.: 727,811

[22] Filed: Jul. 8, 1991

Related U.S. Application Data

[63] Continuation-in-part of Ser. No. 458,120, Dec. 28, 1989, abandoned.

[51] Int. Cl.[5] .................... H03K 19/02; H03K 19/20; H03K 19/21; H03K 17/51
[52] U.S. Cl. ................................ 307/446; 307/451; 307/471; 307/570
[58] Field of Search ............... 307/443, 448, 451, 446, 307/570, 471, 270

[56] References Cited

U.S. PATENT DOCUMENTS

| | | | |
|---|---|---|---|
| 4,417,314 | 11/1983 | Best | 364/716 |
| 4,558,234 | 12/1985 | Suzuki et al. | 307/443 |
| 4,577,124 | 3/1986 | Koike | 307/451 |
| 4,620,117 | 10/1986 | Fang | 307/443 |
| 4,633,220 | 12/1986 | Burgess | 307/463 |
| 4,837,462 | 6/1989 | Watanabe et al. | 307/443 |
| 4,882,534 | 11/1989 | Koshizuka | 307/446 |
| 4,950,920 | 8/1990 | Hara et al. | 307/443 |
| 4,950,925 | 8/1990 | Doi et al. | 307/570 |
| 4,975,600 | 12/1990 | Trah et al. | 307/443 |
| 4,999,518 | 3/1991 | Dhong et al. | 307/443 |
| 5,043,601 | 8/1991 | Cornelissen | 307/443 |

FOREIGN PATENT DOCUMENTS

8607173 12/1986 PCT Int'l Appl. .

Primary Examiner—Stanley D. Miller
Assistant Examiner—Terry D. Cunningham
Attorney, Agent, or Firm—A. Tamoshunas; J. Haken; R. Meetin

[57] ABSTRACT

A circuit employable as a differential multiplexer (10, 310, or 610) or as a differential logic gate (110, 210, 250, 410, or 510) of either the OR/NOR or EXCLUSIVE OR/EXCLUSIVE NOR type contains four pass gates that operate on four circuit input signals and are controlled by two additional circuit input signals. Two of the pass gates drive a bipolar transistor serially coupled to a first FET driven from the other two pass gates. Likewise, the second pair of pass gates drive another bipolar transistor serially coupled to another FET driven from the first pair of pass gates. The bipolar transistors supply respective circuit output signals. The two FETs are of a first polarity. The circuit preferably includes a pair of FETs of a second polarity opposite to the first polarity. The second pair of FETs are arranged so as to provide output pull-up/pull-down assistance for the bipolar transistors.

12 Claims, 8 Drawing Sheets

CIRCUIT SUITABLE FOR DIFFERENTIAL MULTIPLEXERS AND LOGIC GATES UTILIZING BIPOLAR AND FIELD-EFFECT TRANSISTORS

CROSS REFERENCE TO RELATED APPLICATIONS

This is a continuation-in-part of U.S. patent application Ser. No. 458,120 filed Dec. 28, 1989, now abandoned. This also relates to U.S. patent application Ser. No. 458,217 likewise filed Dec. 28, 1989.

FIELD OF USE

The present invention relates to semiconductor devices that employ both bipolar transistors and field-effect transistors ("FETs"). More particularly, this invention relates to circuits which can be implemented as BiCMOS multiplexers and logic gates, such as OR/NOR and EXCLUSIVE OR/EXCLUSIVE NOR ("XOR/XNOR") gates, that receive differential input signals and provide high-drive low-delay differential output signals.

BACKGROUND ART

The new technology of BiCMOS which utilizes both bipolar and CMOS transistors in a single device has been explored increasingly in the past few years. The advantage of BiCMOS circuits over conventional CMOS or bipolar circuits is that the high speed characteristic of bipolar circuits can be obtained with an integration density and a low power consumption characteristic of CMOS circuits.

BiCMOS buffers, inverters, and gates are known in the art. However, the BiCMOS technology has not been commonly applied to multiplexers or to logic gates having structures similar to multiplexers.

As an example of prior art logic gates, see Best, U.S. Pat. No. 4,417,314, which discloses a CMOS logic circuit that provides AND, OR, XOR, and XNOR outputs. Also see Adair, PCT Patent Publication W086/07173, which discloses a full adder circuit comprised of simple two-input gates and a pair of CMOS pass transistor multiplexers. Neither disclosure utilizes BiCMOS technology. Also, neither disclosure utilizes a differential input or provides a differential output.

GENERAL DISCLOSURE OF THE INVENTION

It is an object of the present invention to provide a circuit that can be employed as a differential input, differential output BiCMOS multiplexer or as a differential input, differential output BiCMOS logic gate of either the OR/NOR type or the XOR/XNOR type.

In accordance with the invention, the present circuit contains four input pass gates referred to as the first, second, third, and fourth pass gates. The first pass gate is normally an FET but may be a bipolar transistor. Each of the other three pass gates is usually an FET. Each pass gate thus has first and second flow electrodes and a control electrode that controls current flow between the flow electrodes.

The first electrodes of the four pass gates respectively respond to first, second, third, and fourth circuit inputs. The control electrodes of the first and third pass gates respond to a fifth circuit input. The control electrodes of the second and fourth pass gates respond to a sixth circuit input.

Before going into the rest of the components of the invention, note that each bipolar transistor in the circuit has a collector, a base, and an emitter. Each FET has a drain, a gate electrode, and a source.

The second electrodes of the first and second pass gates are coupled to the base of a first bipolar transistor. The second electrodes of the third and fourth pass gates are likewise coupled to the base of a like-polarity second bipolar transistor. A pair of circuit outputs are available from emitters of the two bipolar transistors. Their collectors are preferably coupled to a first voltage rail.

The emitters of the first and second bipolar transistors are respectively coupled to the drains of first and second FETs of a first polarity. The gate electrode of the first FET is coupled to the second electrodes of the third and fourth pass gates. The gate electrode of the second FET is similarly coupled to the second electrodes of the first and second pass gates. The sources of both FETs are preferably coupled to a second voltage rail. As a result, the two FETs function as "pull-down" devices when the first rail is high compared to the second rail.

The circuit also contains first and second FETs of a second polarity opposite to the first polarity so that the circuit is a BiCMOS device. The sources of these two additional FETs are coupled to the first voltage rail. By virtue of this coupling and the drain/gate electrode couplings described below, the additional two FETs act as "pull-up" devices when the first rail is high relative to the second.

In a main embodiment of the invention, the drains of the first and second FETs of the second polarity are respectively coupled to the bases of the second and first bipolar transistors, while their gate electrodes are respectively coupled to the emitters of the first and second bipolar transistors.

In this embodiment, the circuit may include third and fourth FETs of the second polarity. If included, their drains are respectively coupled to the emitters of the first and second bipolar transistors, while their sources are coupled to the first voltage rail. The gate electrode of the third FET of the second polarity is coupled to the gate electrode of the first FET of the first polarity so as to form an inverter. The gate electrode of the fourth FET of the second polarity is likewise coupled to that of the second FET of the first polarity so that these two FETs also form an inverter.

In a typical application of the invention, the first and third inputs form a first differential input, the second and fourth inputs form a second differential input, the fifth and sixth inputs form a differential select input, and the outputs form a differential output. The circuit then functions as a fully differential multiplexer.

By coupling the first electrodes of the first and second pass gates respectively to the first electrodes of the fourth and third pass gates, the multiplexer becomes a fully differential XOR/XNOR gate. The first and second differential inputs thereby become a single differential input, whereas the differential select input serves as a second differential input to the XOR/XNOR gate. Alternatively, by tying the first electrodes of the first and third pass gates respectively to the first and second rails, the multiplexer is converted into a fully differential OR/NOR gate.

The invention may be extended to include fifth and sixth pass gates, each having first and second flow electrodes and a control electrode that controls current flow between the flow electrodes. The first electrodes of the fifth and sixth pass gates are respectively responsive to seventh and eighth inputs. The control electrodes are responsive to a ninth input, while the second electrodes are respectively coupled to the bases of the first and second bipolar transistors.

This extension of the invention is typically employed as a multiplexer in the manner basically described above. The seventh and eighth inputs form a third differential input to the multiplexer. However, instead of using the fifth and sixth inputs as a differential select input, those two inputs and the ninth inputs are operated as simple selects inputs where only one of them provides a pass-gate activation signal at any time.

The multiplexer and gates of the invention are useful for many purposes, including parity checks, DRAM control, and for use in floating-point processors.

BRIEF DESCRIPTION OF THE DRAWINGS

Inverted inputs and outputs are indicated with prime ("'") signs in the drawings and description of the preferred embodiments.

DESCRIPTION OF THE PREFERRED EMBODIMENTS

Before describing the circuits shown in the figures, note that the term "BiCMOS" is used in a broad sense here to refer to circuits having both bipolar transistors and FETs, regardless of whether MOS FETs or other types of insulated-gate FETs are used. In fact, any description of an FET as an MOS transistor is intended to be understood in its broadest sense to include other types of insulated-gate FETs and not to be limited to metal-gate FETs. Also, while circuits are described as preferably including npn bipolar transistors, if the polarities of the bipolar and MOS transistors are reversed, equivalent functional circuits are obtained. Thus, "pull-up" transistors become "pull-down" transistors, and vice versa. Further, while "inputs" and "outputs" to and from a circuit are described, little distinction is provided regarding whether the inputs and outputs are signals or nodes, as those skilled in the art will readily understand whether a signal or node is intended.

A transistor pass gate of the type discussed below has first and second flow electrodes and a control electrode for controlling current flow between the flow electrodes. When a pass gate is an FET, its first source/drain electrode (e.g., drain), second source/drain electrode (e.g., source), and gate electrode respectively are the first flow, second flow, and control electrodes. Similarly, these electrodes respectively are the collector, emitter, and base in the case of a bipolar transistor.

Figure 1:
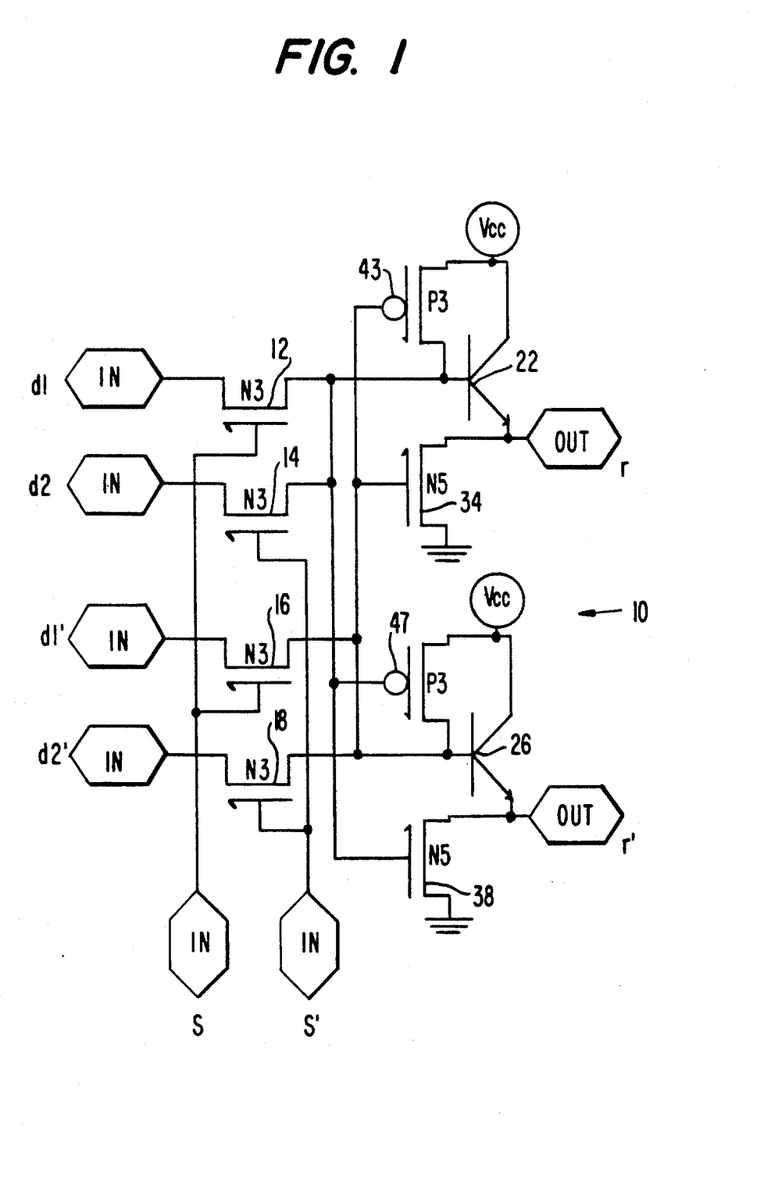
FIG. 1, 6, and 9 are circuit diagrams of BiCMOS differential input, differential output multiplexers of the invention.

Turning to FIG. 1, it shows a fully differential BiCMOS multiplexer 10 of the invention. The input signals to multiplexer 10 consist of noninverted and inverted inputs d1 and d1' of a first differential data input, noninverted and inverted inputs d2 and d2' of a second differential data input, and noninverted and inverted inputs S and S' of a differential select input. Multiplexer 10 provides a differential data output formed with noninverted and inverted outputs r and r'.

Multiplexer 10 contains four single nMOS FET input pass gates 12, 14, 16, 18, two npn output pull-up bipolar transistors 22 and 26, two nMOS output pull-down FETs 34 and 38, and two pMOS pull-up FETs 43 and 47. Data inputs d1, d2, d1', and d2' are respectively applied to the first source/drain electrodes (drains here) of nMOS pass gates 12, 14, 16, and 18. Noninverted select input S is applied to the gate electrodes of pass gates 12 and 16, while inverted select input S' is applied to the gate electrodes of pass gates 14 and 18. The second source/drain electrodes (sources here) of FETs 12 and 14 are both connected to the base of npn transistor 22. The second source/drain electrodes (again sources here) of FETs 16 and 18 are both connected to the base of npn transistor 26.

For purposes of brevity, reference to an FET source/drain electrode hereafter will be abbreviated to simply the drain or source based on the polarity of the circuit described. Similarly, the gate electrode will simply be referred to as the gate.

Bipolar transistor 22 has its collector tied to a voltage rail at which a high voltage Vcc is supplied. Noninverted output r is taken from the emitter of transistor 22. The base of transistor 22 is connected to the drain of pMOS FET 43 whose source is tied to the high (Vcc) voltage rail. The gate of pMOS FET 43 is connected to the sources of pass gates 16 and 18. Also connected to the gate of FET 43 is the gate of nMOS FET 34. The drain of FET 34 is connected to the emitter of npn transistor 22 (i.e., the r output), while the source of FET 34 is tied to a voltage rail at which a low voltage (e.g., ground) is supplied.

Bipolar transistor 26 is arranged similarly to bipolar transistor 22. The collector of transistor 26 is connected to the high voltage rail. Inverted output r' is taken from the emitter of transistor 26. The base of transistor 26 is further connected to the drain of pMOS FET 47 whose source is tied to the high rail. The gate of pMOS FET 47 is connected to the sources of pass gates 12 and 14. Also connected to the gate of FET 47 is the gate of nMOS FET 38. The drain of FET 38 is connected to the emitter of npn transistor 26 (i.e., the r' output), while the source of FET 38 is tied to the low voltage rail.

In operation, the differential select input acts to select one of the differential data inputs. When noninverted select signal S is high, inputs d1 and d1' are selected. In the following manner, the signal (i.e., high or low) at the d1 noninverted input is transmitted to the noninverted r output while the opposite signal (i.e., low or high) at the d1' inverted input is transmitted to the inverted r, output. When S is high, S' is low. Hence, pass gates 12 and 16 are turned on, whereas pass gates 14 and 18 are turned off. As a result, noninverted signal d1' passes through FET 12 and is fed to the base of npn transistor 22 and to the gate of nMOS FET 38. Simultaneously, inverted signal d1' passes through FET 16 and is fed to the base of npn transistor 26 and to the gate of nMOS FET 34. If signal d1 goes high, npn transistor 22 turns on and pulls output r to a high voltage. Conversely, npn transistor 26 turns off and nMOS FET 38 turns on. This drives inverted output r' quickly low towards the voltage at the source of FET 38.

When input d1 is selected and high, the high voltage is applied to the gate of pMOS FET 47, keeping it off. Thus, nMOS FET 38, which is on, controls the voltage at the r' inverted output. Also, input d1, is selected and low at this point, and the low voltage is applied to gate of pMOS FET 43, turning it on, and to the gate of nMOS FET 34, keeping it off. When pMOS FET 43 turns on, the voltage Vcc at its source is transferred to its drain, thereby pulling the base of npn transistor 22 all the way up to the high voltage rail. Thus, output r is pulled up to Vcc - Vbe, where Vbe is the standar base-emitter voltage drop of a bipolar transistor when it just turns on.

When input d1 is selected and low, the low voltage is applied to the base of npn transistor 22, to the gate of pMOS FET 47, and to the gate of nMOS FET 38. Also, input d1' is selected and high at this time, and the high voltage is applied to the base of npn transistor 26, to the gate of pMOS FET 43, and to the gate of nMOS FET 34. As a result, npn transistor 22 and pMOS FET 43 turn off while pull-down nMOS FET 34 turns on. The voltage at the r noninverted output is then controlled by nMOS FET 34 —i.e., output r is pulled low. Conversely, npn transistor 26 quickly turns on, followed by pMOS FET 47 turning on, while pMOS FET 38 turns off. Consequently, the voltage at the r, inverted output is quickly pulled high by npn transistor 26, and then is pulled all the way up to Vcc - Vbe by pMOS FET 47.

When noninverted select input S goes low, and inverted select input S' goes high, pass gates 12 and 16 turn off, whereas pass gates 14 and 18 turn on. As a result, inputs d2 and d2' are selected. Because the sources of pass gates 12 and 14 are connected together, as are the sources of pass gates 16 and 18, inputs d2 and d2' are applied to npn transistors 22 and 26, to nMOS FETs 34 and 38, and to pMOS FETs 43 and 47 in exactly the same manner discussed above with reference to inputs d1 and d1'. As a result, the circuit of FIG. 1 constitutes a differential input, differential output multiplexer having high output drive and controlled by a differential select input.

Figure 2:
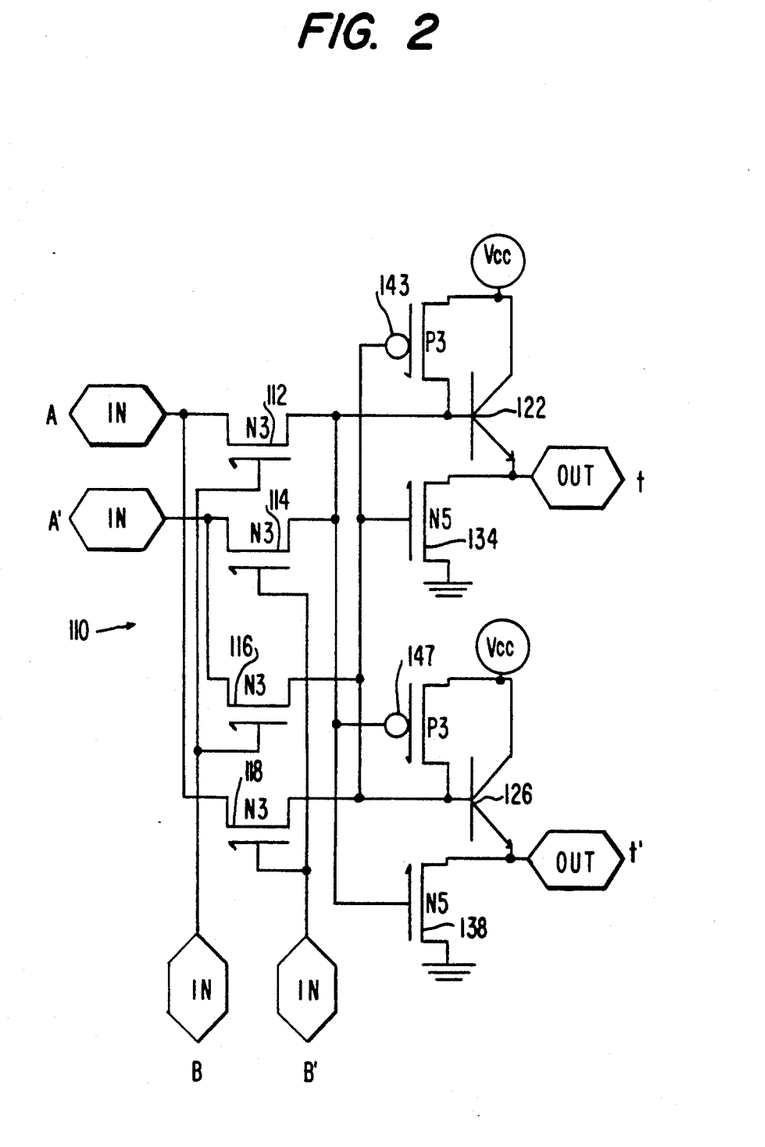
FIGS. 2 and 7 are circuit diagrams of BiCMOS differential input, differential output XOR/XNOR gates of the invention.

By taking multiplexer 10 of FIG. 1 and connecting the d1 input to the d2' input, and also connecting the d1' input to the d2 input, a fully differential XOR/XNOR gate is created by using the connected data inputs act as a first differential input and using the select inputs as a second differential input. FIG. 2 illustrates this arrangement in which the connected d1 and d2' inputs are called the A input, the connected d2 and d1' inputs are called the A' input, and the S and S' select inputs are called the B and B' inputs. The differential outputs of XOR/XNOR gate 110 in FIG. 2 are called the t and t' outputs, with output t providing the logical output A XNOR B, and output t' providing the logical output A XOR B. The circuit of FIG. 2 is identical to that of FIG. 1 except for the connected data inputs. The transistors are numbered similarly except that their numbers are one hundred higher in FIG. 2.

In operation, when A and B are both low, A' and B' are high. Thus, nMOS pass gates 114 and 118 are turned on. A high voltage is generated at the source of FET 114, and a low voltage is generated at the source of FET 118. With reference to the above discussion about FIG. 1, bipolar transistor 122 turns on, pulling noninverted output t high, whereas npn transistor 126 turns off and nMOS FET 138 turns on to pull inverted output t' low.

When A is high and B is low, A' is low and B' is high. Thus, pass gates 114 and 118 are turned on. A low voltage is generated at the source of FET 114, while a high voltage is generated at the source of FET 118. Again with reference to the discussion about FIG. 1, bipolar transistor 122 turns off and nMOS FET 134 turns on. Noninverted output t is thereby pulled low. On the other hand, nMOS FET 138 turns off and npn transistor 126 turns on (because of the high voltage at the source of pass gate 118). This pulls inverted output t' high.

When A is low and B is high, A' is high and b' is low. Thus, pass gates 112 and 116 are turned on. A low voltage is generated at the source of FET 112, while a high voltage is generated at the source of FET 116. Bipolar transistor 122 turns off and nMOS FET 134 turns on, pulling noninverted output t low. Also, with a high voltage at the source of pass gate 116, bipolar transistor 126 turns on, pulling inverted output t' high.

When both A and B are high, A' and b' are low. Thus, pass gates 112 and 116 are turned on, and a high voltage is generated at the source of FET 112, whereas a low voltage is generated at the source of FET 116. Bipolar transistor 122 turns on, pulling noninverted output t high. Also, nMOS FET 138 turns on and pulls inverted output t' low, as the low voltage at the source of pass gate 116 turns npn transistor 126 off.

A review of the above reveals that gate 110 is governed by the following truth table:

| A | A' | B | B' | t | t' |
|---|----|----|----|----|----|
| 0 | 1 | 0 | 1 | 1 | 0 |
| 1 | 0 | 0 | 1 | 0 | 1 |
| 0 | 1 | 1 | 0 | 0 | 1 |
| 1 | 0 | 1 | 0 | 1 | 0 |

Clearly, output t is A XNOR B, while output t' is A XOR B. Thus, an XOR/XNOR gate is established.

Figure 3:
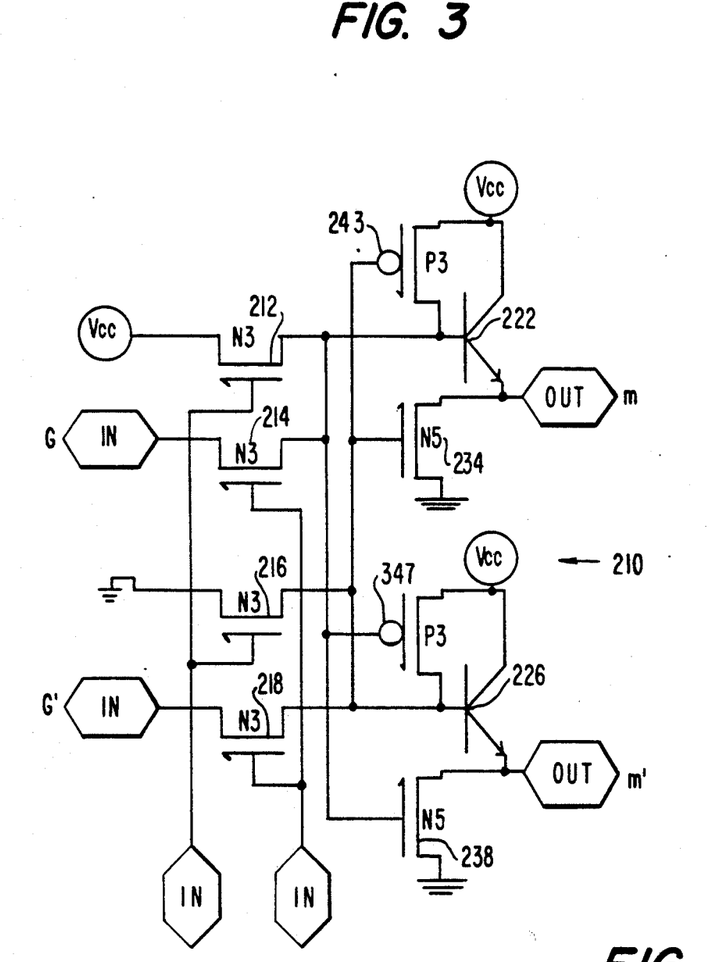
FIGS. 3, 5, and 8 are circuit diagrams of BiCMOS differential input, differential output OR/NOR gates of the invention.
Figure 4:
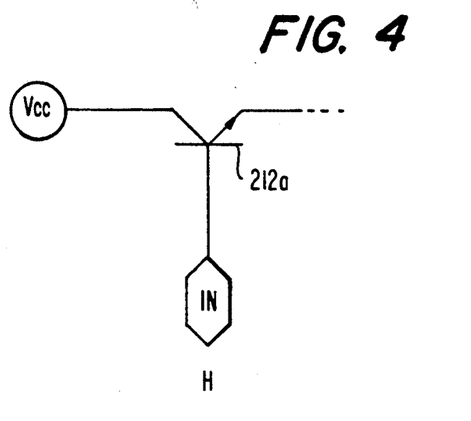
FIG. 4 is a circuit diagram of an alternative implementation of the first pass gate in FIGS. 3 and 8.

Turning to FIG. 3, it shows a first fully differential OR/NOR gate 210 of the invention having first and second differential inputs G, G' and H, H' and a differential (OR/NOR) output m, m'. The transistors comprising the OR/NOR gate of FIG. 3 are identical to those of the multiplexer of FIG. 1, except that they are numbered two hundred higher in FIG. 3. In particular, gate 210 contains nMOS pass gates 212, 214, 216, and 218, npn pull-up transistors 222 and 226, nMOS pull-down FETs 234 and 238, and pMOS pull-up FETs 243 and 247. If desired, and as shown in FIG. 4, nMOS pass gate 212 can be replaced with a bipolar npn transistor pass gate 212a whose collector, base, and emitter are respectively connected the same as the drain, gate, and source of pass gate 212. The only other differences between this OR/NOR gate and the multiplexer of FIG. 1 are the inputs, and the fact that pass gates 212 and 216 have their drains respectively connected to the high (Vcc) and low (ground) voltage rails.

In operation, when both G and H are low, G' and H' are high. As a result, pass gates 214 and 218 are turned on. The low G voltage is transferred to the source of FET 214, while the high G' voltage is transferred to the source of FET 218. Bipolar transistor 226 turns on and nMOS FET 238 turns off, whereas bipolar transistor 222 turns off and nMOS FET 234 turns on. Inverted output m' is thereby pulled high, while noninverted output m is pulled low. Also, pMOS FET 247 turns on and pulls the base of npn transistor 226 all the way up to Vcc.

When G is low and H is high, G' is high and H' is low. Pass gates 212 and 216 are turned on and respectively provide high (Vcc) and low (ground) voltages at their respective sources. Bipolar transistor 222 and nMOS FET 238 turn on, while bipolar transistor 226 and nMOS FET 234 turn off. As a result, noninverted output m is pulled high, while inverted output m' is pulled low. This time, pMOS FET 247 turns off to prevent dissipation of current from the high rail to ground, thereby providing zero static power usage.

When both G and H are high, circuit 210 functions the same as when G is low and H is high. This occurs because pass gates 212 and 216 which are connected to the H input are not connected directly to the G and G' inputs. Thus, regardless of the value of G, when H is high, the voltage at the base of npn transistor 222 is high, and the voltage at the base of npn transistor 226 is low. Noninverted and inverted outputs m and m' respectively go high and low.

When G is high and H is low, G' is low and H' is high. As a result, pass gates 214 and 218 are turned on. The source of FET 214 goes high, while the source of FET 218 goes low. In this situation, circuit 210 acts the same as in the situation where H is high. Noninverted output m again goes high, while inverted output m' again goes low.

A review of the above reveals that gate 210 is governed by the following truth table:

| G | G' | H | H' | m | m' |
|---|----|---|----|---|----|
| 0 | 1  | 0 | 1  | 0 | 1  |
| 1 | 0  | 0 | 1  | 1 | 0  |
| 0 | 1  | 1 | 0  | 1 | 0  |
| 1 | 0  | 1 | 0  | 1 | 0  |

Clearly, output m is the logical output G OR H, while output m' is the logical output G NOR H. Thus, an OR/NOR gate is established.

Also, according to DeMorgan's theorem, a differential OR gate becomes a differential NAND gate when the inverted and noninverted inputs of the differential signals are switched (e.g., signal G is applied to the G' input, signal G' is applied to the G input, signal H is applied to the H' input, and signal H' is applied to the H input). Likewise, a NOR gate becomes an AND gate when the inverted and noninverted inputs of the differential signals are switched. Hence, the OR/NOR gate of FIG. 3 may also be used as an AND/NAND gate.

Figure 5:
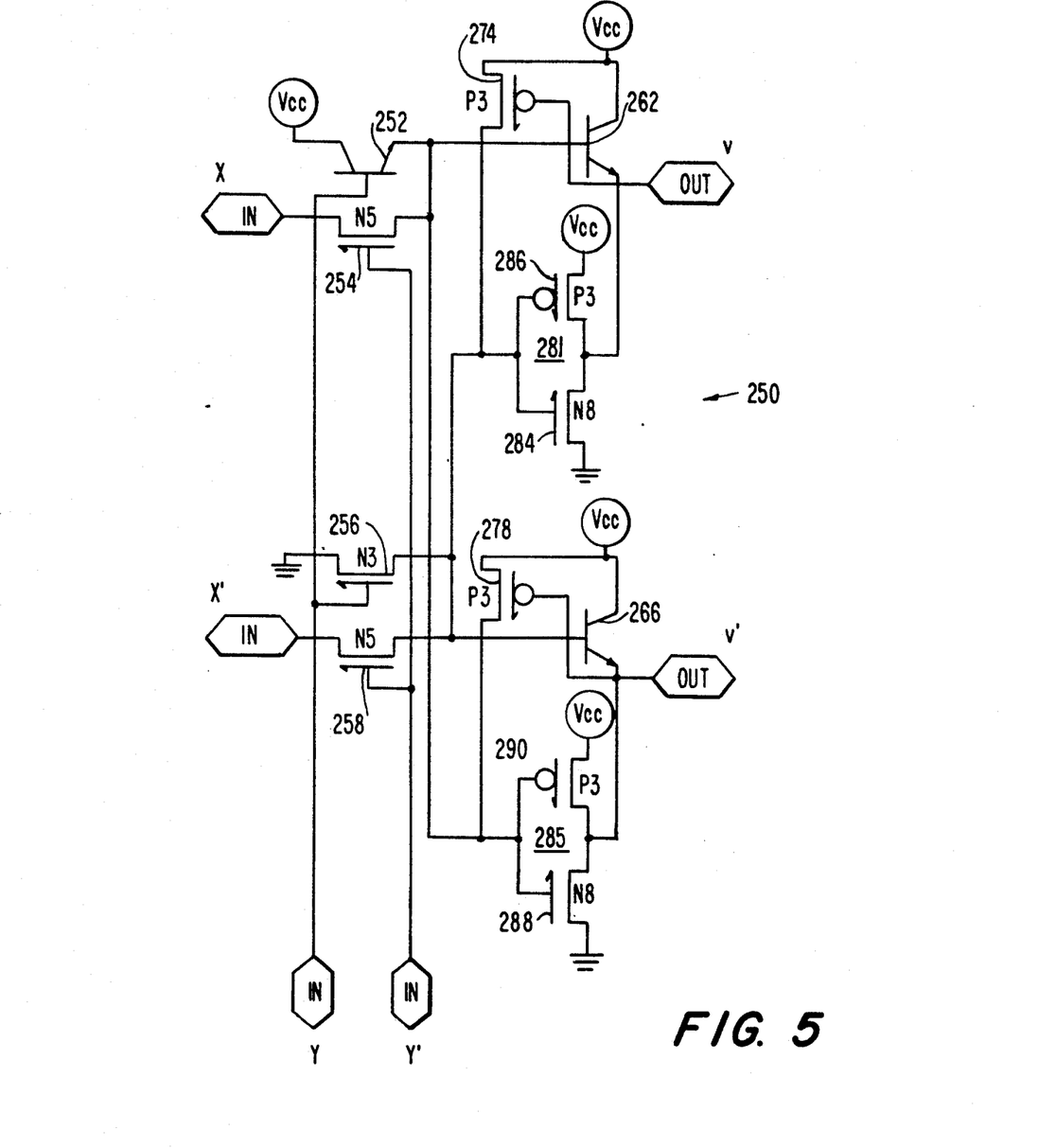

FIG. 5 depicts a second fully differential OR/NOR gate 250 of the invention having first and second differential inputs X, X, and Y, Y' and a differential (OR/NOR) output v, v, OR/NOR gate 250 utilizes an npn bipolar transistor pas gate 252 (although an nMOS FET could be used instead), nMOS FET pass gates 254, 256, and 258, two npn pull-up transistors 262 and 266, two pMOS pull-up FETs 274 and 278, and two inverters 281 and 285.

Noninverted and inverted inputs X and X, are respectively supplied to the drains of nMOS pass gates 254 and 258. The drain of nMOS pass gates 256 is tied to the low voltage rail, while the collector of npn pass gate 252 is tied to the high (Vcc) voltage rail. The base of npn transistor 252 and the gate of FET 256 receive noninverted input Y, while the gates of FETs 254 and 258 receive inverted input Y'. The emitter of npn transistor 252 and the source of nMOS FET 254 are both connected to the base of npn transistor 262, while the sources of nMOS FETs 256 and 258 are connected to the base of npn transistor 266. Noninverted (OR) output v is taken from the emitter of npn transistor 262, while inverted (NOR) output v' is taken from the emitter of npn transistor 266.

The collectors of npn transistors 262 and 266 are tied to the high voltage rail. The emitter of bipolar transistor 262 is connected to the gate of pMOS FET 274 whose source is tied to the high rail. The drain of FET 274 is connected to the sources of pass gates 256 and 258 and to the input of inverter 281. The inverted output from inverter 281 is connected to the emitter of npn transistor 262. Similarly, the emitter of bipolar transistor 266 is connected to the gate of pMOS FET 278 whose source is tied to the high rail. The drain of FET 278 is connected to the source of pass gate 254, to the collector of pass gate 252, and to the input of inverter 285. Its inverted output is connected to the emitter of npn transistor 266.

Inverters 281 and 285 preferably are standard CMOS inverters. As shown in FIG. 5, inverter 281 consists of an nMOS FET 284 and a pMOS FET 286 whose gates are connected to the base of npn transistor 266, whose drains are connected to the emitter of npn transistor 262, and whose sources are respectively tied to the low and high rails. Likewise, inverter 285 is formed with an nMOS FET 288 and a pMOS FET 290 whose gates are connected to the base of transistor 262, whose drains are connected to the base of transistor 266, and whose sources are respectively tied to the low and high rails. FETs 284 and 288 are, in fact, situated in largely the same place as FETs 234 and 238 in FIG. 3.

In operation, when both X and Y are low, X' and Y' are high. As a result, pass gates 254 and 258 are turned on. The low X voltage is transferred to the source of FET 254, while the high X' voltage is transferred to the source of FET 258. Bipolar transistor 266 thereby turns on while bipolar transistor 262 turns off. Inverted output v' goes high. Also, with the source of nMOS transistor 258 high, inverter 281 provides a low voltage to the v noninverted output. This low voltage is also applied to the gate of pMOS FET 274 so as to turn it on. FET 274 then pulls the voltage at the input to inverter 281 up to Vcc, thereby guaranteeing that the voltage at the output of inverter 281 which also serves as noninverted output v is as low as possible. Similarly, with the source of nMOS FET 254 low, inverter 285 provides a high output which pulls the high voltage at the emitter of npn transistor 266 even higher. As a result, transistor 266 turns off, and inverter 285 keeps inverted output v' high. Thus, output v' is maintained high with zero static power.

When X is low and Y is high, X' is high and Y' is low. Pass gates 252 and 256 are turned on and respectively provide high (Vcc - Vbe) and low (ground) voltages at their emitter and source. With the emitter of transistor 252 high, inverter 285 quickly provides a low voltage to the v' inverted output. Bipolar transistor 266 turns off. As inverted output v' goes low, pMOS FET 278 turns on and pulls the voltage at the input of inverter 285 all the way up to Vcc. In turn, inverter 285 provides an even lower voltage to the v' inverted output. Conversely, when the voltage at the emitter of transistor 252 goes high, it quickly turns on npn transistor 262 which provides a high voltage at the v noninverted output. Also, with the source of pass gate 256 at ground, inverter 281 provides a high voltage that pulls noninverted output v up to its maximum. As the voltage at the v output is pulled above the base voltage of transistor 262, it turns off.

When X and Y are both high, circuit 250 functions the same as when X is low and Y is high. This occurs because pass gates 252 and 256 which are connected to the Y input are not connected directly to the X and X' inputs. Thus, regardless of the value of X, when Y is high, the voltage at the base of npn transistor 262 is high, and the voltage at the base of npn transistor 266 is low. Outputs v and v' respectively go high and low.

When X is high and Y is low, X' is low and Y' is high. As a result, pass gates 254 and 258 are turned on. The source of FET 254 goes high while the source of FET 258 goes low. In this case, circuit 250 acts the same as in the case where Y is high. Noninverted output v goes high, while inverted output v' goes low.

In view of the above, gate 250 is governed by the following truth table:

| X | X' | Y | Y' | v | v' |
|---|----|---|----|---|----|
| 0 | 1  | 0 | 1  | 0 | 1  |
| 1 | 0  | 0 | 1  | 1 | 0  |
| 0 | 1  | 1 | 0  | 1 | 0  |
| 1 | 0  | 1 | 0  | 1 | 0  |

Thus, a second OR/NOR gate is established. Again, under deMorgan's theorem, the OR/NOR gate of FIG. 5 may also be used as an AND/NAND gate if the inputs are reversed.

Figure 6:
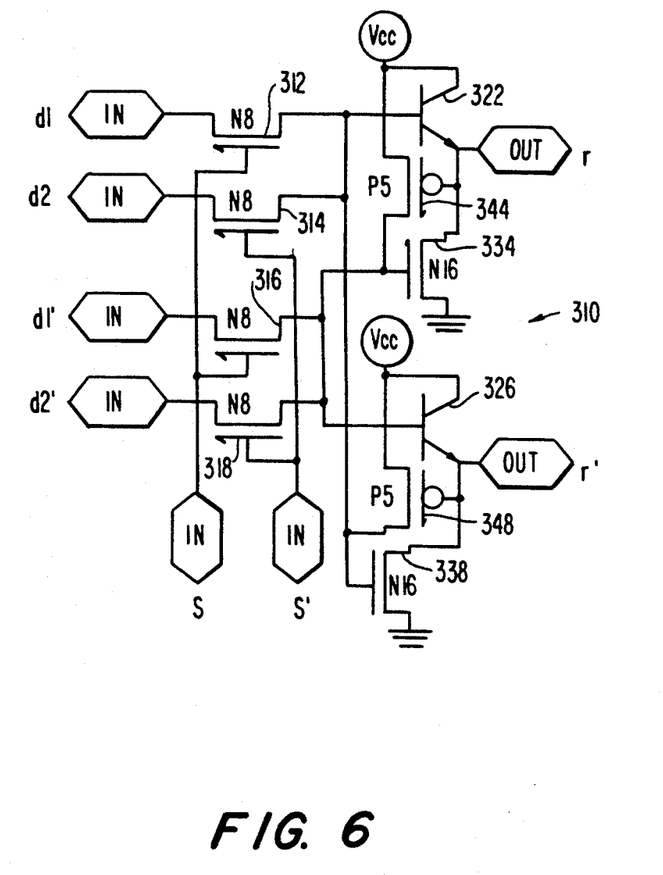

Referring to FIG. 6, it shows another fully differential BiCMOS multiplexer 310. As with multiplexer 10 in FIG. 1, multiplexer 310 produces a differential data output consisting of outputs r and r' in response to a first differential data input formed with inputs d1 and d1', a second differential data input formed with inputs d2 and d2', and a differential select input formed with inputs S and S'. Multiplexer 310 contains nMOS pass gates 312, 314, 316, and 318, npn transistors 322 and 326, and nMOS FETs 334 and 338 all respectively interconnected in the same manner as transistors 12, 14, 16, 18, 22, 26, 34, and 38 in multiplexer 10.

The difference between the two multiplexers is that multiplexer 310 employs pMOS FETs 344 and 348 to help perform the pull-up function in place of FETs 43 and 47 in multiplexer 10. As indicated in FIG. 6, the sources of FETs 344 and 348 are tied to the high rail. Their gate electrodes are respectively connected to the emitters of npn transistors 322 and 326. The drains of FETs 344 and 348 are respectively connected to the bases of transistors 326 and 322.

Multiplexer 310 operates substantially the same as multiplexer 10 except as follows. When noninverted input d1 or d2 is selected and brought high so that nMOS FET 338 turns on, pMOS FET 348 turns on and pulls the base of npn transistor 322 up to Vcc. Output r thereby reaches Vcc - Vbe. Similarly, when inverted input d1' or d2' is selected and brought high so as to turn on nMOS FET 334, pMOS FET 344 turns on and pulls the base of npn transistor 322 up to Vcc. In this case, output r' reaches Vcc - Vbe.

A comparison with the operation of multiplexer 10 indicates that FET 344 basically replaces FET 47, while FET 348 basically replaces FET 43. This replacement, however, provides a significant advantage. Because the pull-up FETs in multiplexer 310 are driven from the emitters of the bipolar transistors rather than from their bases as in multiplexer 10, the voltages at the gate electrodes of the pull-up FETs have less turn-on travel distance in multiplexer 310 than in multiplexer 10. In addition, the gate capacitance of the pull-up FETs in multiplexer 310 is driven from the circuit outputs, whereas the gate capacitance of the pull-up FETs in multiplexer 10 is driven primarily from the pass gates. The circuit outputs are better suited to drive the pull-up FET gate capacitance than the pass gates. For these reasons, multiplexer 310 operates somewhat faster than multiplexer 10.

Figure 7:
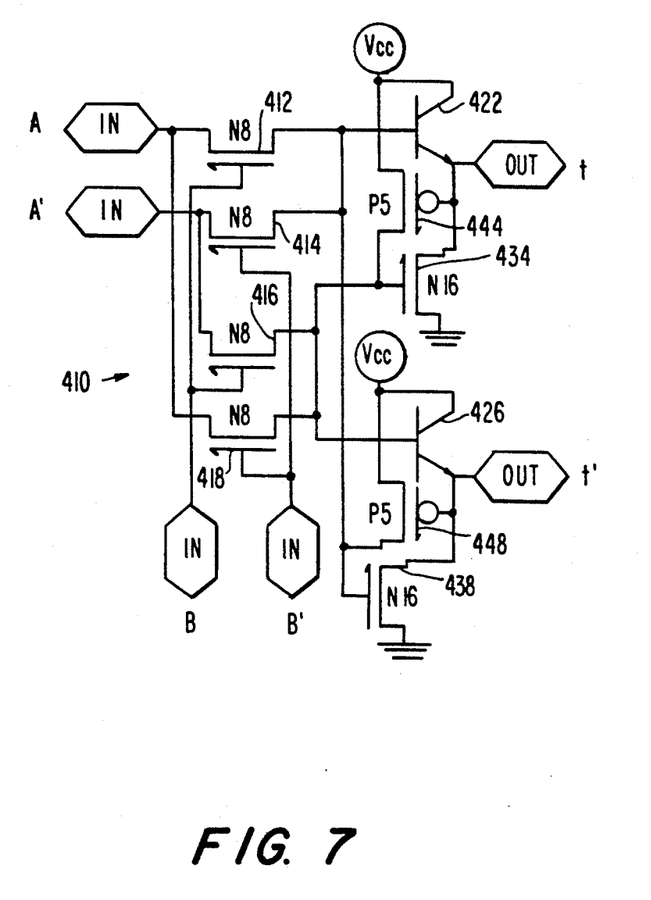
Figure 8:
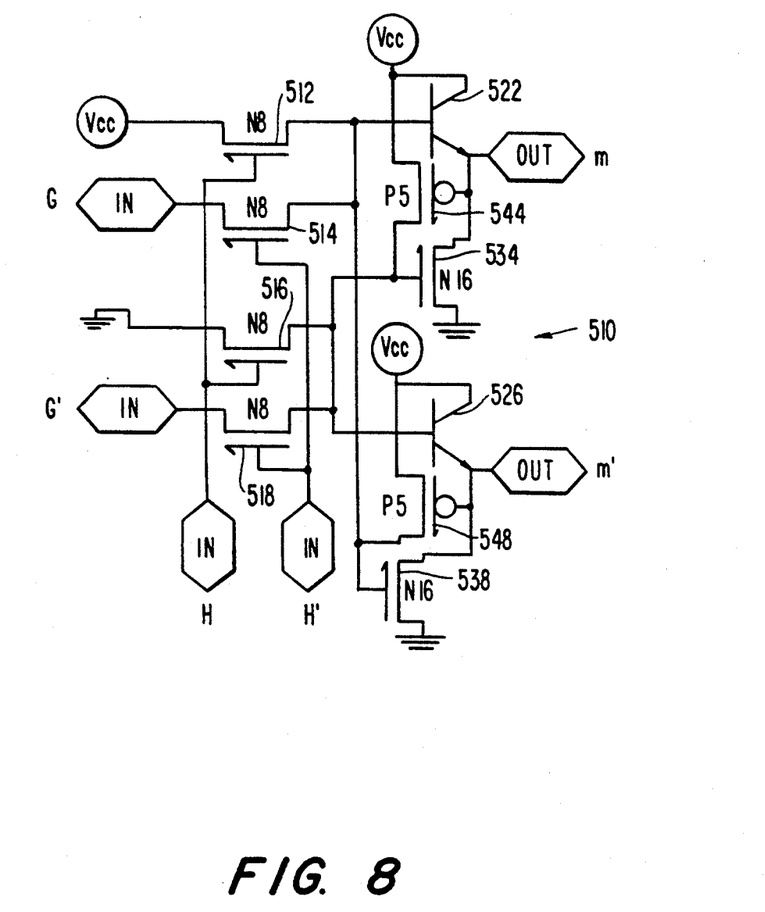

Multiplexer 310 can be converted into logic gates in the same way that multiplexer 10 is converted into logic gates 110 and 210 of FIGS. 2 and 3. Turning to FIG. 7, it illustrates how multiplexer 310 is so adjusted to form a fully differential XOR/XNOR logic gate 410 analogous to XOR/XNOR gate 110. FIG. 8 shows how multiplexer 310 is transformed into a fully differential OR/NOR logic gate 510 analogous to OR/NOR gate 210. Based on what has been described above, the constituency and operation of gates 410 and 510 should be self-evident. Accordingly, nothing further need be said here about them except to note that a bipolar transistor such as that shown in FIG. 4 could be used in place of the nMOS FET that forms pass gate 512 in multiplexer 510.

Figure 9:
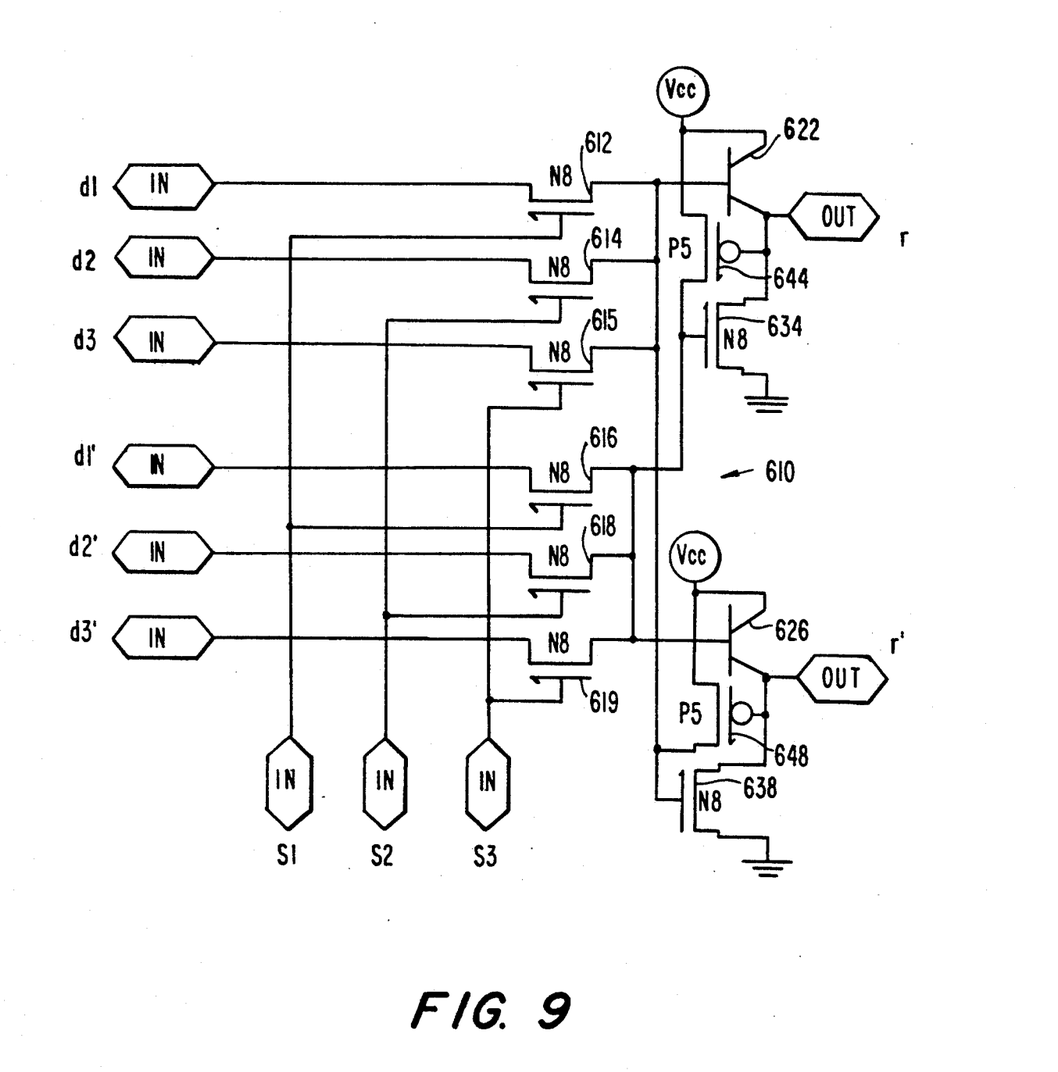

The present multiplexer can be readily extended to have three or more differential data inputs. Turning to FIG. 9, it depicts a differential input, differential output multiplexer 610 that constitutes an example of this extension. As data inputs, multiplexer 610 receives a first differential input formed with inputs d1 and d1', a second differential input formed with inputs d2 and d2' and a third differential input formed with inputs d3 and d3'. Multiplexer 610 produces a differential output consisting of outputs r and r' in response to these three differential data inputs and three select inputs S1, S2, and S3.

Multiplexer 610 contains nMOS pass gates 612, 614, 616, and 618, npn transistors 622 and 626, nMOS pull-down FETs 634 and 638, and pMOS pull-up FETs 644 and 648 respectively interconnected in the same way as transistors 312, 314, 316, 318, 322, 326, 334, 338, 344, and 348 in multiplexer 310 of FIG. 6. Select signals S1 and S2 for multiplexer 610 respectively replace select signals S and S' for multiplexer 310.

In addition, multiplexer 610 contains nMOS pass gates 615 and 619 whose sources respectively receive noninverted and inverted inputs d3 and d3'. Select signal S3 is supplied to the gates of nMOS FETs 615 and 619. The drain of pass gate 615 is connected in common with the drains of pass gates 612 and 614 to the base of npn transistor 622. Similarly, the drain of pass gate 619 is connected in common with the drains of pass gates 616 and 618 to the base of npn transistor 626.

During operation, only one of select inputs S1 - S3 is permitted to be high at any time. If, for example, select input S1 is high so as to select the first differential input, select inputs S2 and S3 are low. Pass gates 612 and 614 are then turned on, while pass gates 616, 618, 615, and 619 are turned off. The remaining transistors assume the conductive/non-conductive states described above for multiplexer 310 of FIG. 6. Inputs d1 and d1' are respectively transmitted to the r and r' outputs. In a similar manner, inputs d2 and d2' are respectively passed on to the r and r' outputs when input S2 is high while inputs S1 and S3 are low. Likewise, inputs d3 and d3' are respectively supplied to the r and r' outputs when input S3 is the high select signal.

Based on what has been said about multiplexer 610, extending the present multiplexer to more than three differential data inputs is simple. For each additional differential data input, the circuit is furnished with an additional pair of pass gates controlled by an additional select input in the same way that pass gates 615 and 619 are controlled by select signal S3. The select signals are operated in such a way that only one of them is high at any time. As a result, the signals at the noninverted and inverted inputs of the selected differential data input are respectively transmitted to the noninverted and inverted outputs of the multiplexer.

While the invention has been described with reference to particular embodiments, this description is solely for the purpose of illustration and is not to be construed as limiting the scope of the invention claimed below. For example, pnp bipolar transistors could be used in place of the npn transistors, provided that the polarities of the FETs are reversed. Furthermore, resistors could be utilized in place of the pMOS pull-up FETs. Although, a circuit with resistors instead of the pMOS pull-ups would consume power, the resistors still could be effective in providing a desired differential output.

The bipolar-nMOS combinations of FIGS. 1-3 and 6-9 and the bipolar-inverter combinations of FIG. 5 could be replaced with buffers having additional transistors as shown in U.S. patent application Ser. No. 458,217 mentioned above. Also, while specific FET widths are given in the drawings for preferred embodiments, other widths could be utilized. Although inputs and outputs of the invention have been described as "inverted" or "noninverted", these inputs and outputs are only inverted or noninverted relative to each other. The inputs of a differential input could be reversed without affecting the invention. Various modifications may thus be made without deviating from the true spirit and scope of the invention as defined in the appended claims.

We claim:

1. An electronic circuit for coupling between a first voltage rail and a second voltage rail different from the first rail, the circuit comprising:
    first, second, third, and fourth pass gates, each having first a second flow electrodes and a control electrode for controlling current flow between the flow electrodes, with the first flow electrodes being respectively responsive to first, second, third, and fourth inputs, the control electrodes of the first and third pass gate being responsive to a fifth input, and the control electrodes of the second and fourth gates being responsive to a sixth input;
    first and second like-polarity bipolar transistors, each having a base, a collector for coupling to the first rail and an emitter, with the base of the first bipolar transistor coupled to the second flow of electrodes of the first and second pass gates, the base of the second bipolar transistor coupled to the second flow electrodes of the third and fourth pass gates, and a pair of outputs being respectively available from the emitters of the bipolar transistors;
    first and second FETs of a first polarity, each having a drain, a source for coupling to the second rail and a gate electrode, with the drains respectively coupled to the emitters of the first and second bipolar transistors, the gate electrode of the first FET coupled to the second flow electrodes of the third and fourth pass gates, and the gate electrode of the second FET coupled to the second flow electrodes of the first and second pass gates; and
    first and second FETs of a second polarity opposite to the first polarity, each having a drain, a source for coupling to the first rail and a gate electrode, with their drains respectively coupled to the bases of the second and first bipolar transistors, and their gate electrodes respectively coupled to the emitters of the first and second bipolar transistors.

2. A circuit as in claim 1 wherein the first pass gate comprises either a bipolar transistor or an FET, and each remaining pass gate comprises an FET.

3. A circuit as in claim 1 wherein the first and third inputs form a first differential input, the second and fourth inputs form a second differential input, the fifth and sixth inputs form a differential select input, and the outputs form a differential output, the circuit functioning as a multiplexer.

4. A circuit as in claim 1 wherein the first and second inputs form a first differential input, the first flow electrodes of the fourth and third pass gates are respectively coupled to the first electrodes of the first and second pass gates, the fifth and sixth inputs form a second differential input, and the outputs form a differential output, the circuit functioning as an XOR/XNOR logic gate.

5. A circuit as in claim 1 wherein the first flow electrodes of the first and third pass gates are respectively coupled to the first and second rails, the second and fourth inputs form a first differential input, the fifth and sixth inputs form a second differential input, and the outputs form a differential output, the circuit functioning as an OR/NOR logic gate.

6. A circuit as in claim 1 wherein the first pass gate comprises an FET.

7. A circuit as in claim 1 wherein the first pass gate comprises a bipolar transistor.

8. A circuit a in claim 1 further including third and fourth FETs of the second polarity, each having a drain, a gate electrode, and a source, for coupling to the first rail, their drains respectively coupled to the emitters of the first and second bipolar transistors, the gate electrode of the third FET of the second polarity coupled to the second flow electrodes of the third and fourth pass gates, and the gate electrode of the fourth FET of the second polarity coupled to the second flow electrodes of the first and second pass gates.

9. A circuit as in claim 8 wherein the first flow electrodes of the first and third pass gates are respectively coupled to the first and second rails, the second and fourth inputs form a first differential input, the fifth and sixth inputs form a second differential input, and the outputs form a differential output, the circuit functioning as an OR/NOR logic gate.

10. A circuit as in claim 9 wherein the first pass gate comprises a bipolar transistor, and each remaining pass gate comprises an FET.

11. A circuit as in claim 1 further including fifth and sixth pass gates, each having first and second flow electrodes and a control electrode for controlling current flow therebetween the bases of the first and second bipolar transistors being respectively coupled to the second flow electrodes of the fifth and sixth pass gates whose first flow electrodes are respectively responsive to seventh and eighth inputs and whose control electrodes are responsive to a ninth input.

12. A circuit as in claim 11 wherein the first and third inputs form a first differential input, the second and fourth inputs form a second differential input, the seventh and eighth inputs form a third differential input, the fifth, sixth, and ninth inputs form select inputs, and the outputs form a differential output, the circuit functioning as a multiplexer.

* * * * *